(12) United States Patent
Teggatz et al.

(10) Patent No.: US 9,599,660 B2
(45) Date of Patent: *Mar. 21, 2017

(54) ELECTRICAL INTERCONNECT STATUS MONITORING SYSTEM

(71) Applicant: Triune IP LLC, Plano, TX (US)

(72) Inventors: Ross E Teggatz, Plano, TX (US); Wayne T Chen, Plano, TX (US); Brett Smith, Plano, TX (US)

(73) Assignee: TRIUNE IP, LLC, Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/165,870

(22) Filed: May 26, 2016

(65) Prior Publication Data

US 2016/0274182 A1 Sep. 22, 2016

Related U.S. Application Data

(63) Continuation of application No. 14/553,941, filed on Nov. 25, 2014, now Pat. No. 9,354,268, which is a continuation of application No. 13/914,501, filed on Jun. 10, 2013, now Pat. No. 8,896,318, which is a continuation of application No. 12/710,307, filed on Feb. 22, 2010, now Pat. No. 8,461,847.

(60) Provisional application No. 61/154,704, filed on Feb. 23, 2009.

(51) Int. Cl.
| | |
|---|---|
| G01R 31/08 | (2006.01) |
| G01R 31/11 | (2006.01) |
| G01R 31/28 | (2006.01) |
| G01R 31/02 | (2006.01) |

(52) U.S. Cl.
CPC ....... *G01R 31/2853* (2013.01); *G01R 31/021* (2013.01); *G01R 31/024* (2013.01); *G01R 31/025* (2013.01)

(58) Field of Classification Search
CPC .... G01R 31/021; G01R 31/025; G01R 31/08; G01R 31/10; G01R 31/11; G01R 31/024; G01R 31/2853; G05B 23/0221
USPC ........ 324/500, 512, 521, 522, 527, 528, 534
See application file for complete search history.

(56) References Cited

U.S. PATENT DOCUMENTS

| | | |
|---|---|---|
| 3,573,751 A | 4/1971 | Delisle |
| 5,461,318 A | 10/1995 | Borchert et al. |
| 5,479,610 A | 12/1995 | Roll-Mecak et al. |
| 6,944,554 B2 | 9/2005 | Kim et al. |
| 7,053,601 B1 | 5/2006 | Fenske et al. |

(Continued)

FOREIGN PATENT DOCUMENTS

| | | |
|---|---|---|
| WO | 2015/195403 A2 | 12/2015 |
| WO | 2016/019137 A2 | 2/2016 |
| WO | 2016/019139 A1 | 2/2016 |

*Primary Examiner* — Hoai-An D Nguyen
(74) *Attorney, Agent, or Firm* — Jackson Walker LLP; Christopher J. Rourk (57) ABSTRACT

Disclosed are advances in the arts with novel methods and apparatus for detecting faulty connections in an electrical system. Exemplary preferred embodiments include basic, ASIC, AC, DC, and RF monitoring techniques and systems for monitoring signals at one or more device loads and analyzing the monitored signals for determining fault conditions at the device loads and/or at the main transmission lines. The invention preferably provides the capability to test and monitor electrical interconnections without fully activating the host system.

19 Claims, 8 Drawing Sheets

(56) References Cited

U.S. PATENT DOCUMENTS

| | | |
|---|---|---|
| 7,215,924 B2 | 5/2007 | Palermo et al. |
| 7,218,120 B2 | 5/2007 | Shimoyama et al. |
| 7,426,239 B2 | 9/2008 | Taghizadeh-Kaschani |
| 7,808,127 B2 | 10/2010 | Teggatz et al. |
| 7,827,334 B2 | 11/2010 | Teggatz et al. |
| 7,859,911 B2 | 12/2010 | Teggatz et al. |
| 7,969,155 B2 | 6/2011 | Varghai et al. |
| 7,982,492 B2 | 7/2011 | Atrash et al. |
| 8,067,948 B2 | 11/2011 | Sequine |
| 8,102,713 B2 | 1/2012 | Teggatz et al. |
| 8,102,718 B2 | 1/2012 | Teggatz et al. |
| 8,300,375 B2 | 10/2012 | Teggatz et al. |
| 8,373,436 B2 | 2/2013 | Atrash et al. |
| 8,408,900 B2 | 4/2013 | Teggatz et al. |
| 8,441,866 B2 | 5/2013 | Teggatz et al. |
| 8,461,847 B2 | 6/2013 | Teggatz et al. |
| 8,552,336 B2 | 10/2013 | Blackall et al. |
| 8,583,037 B2 | 11/2013 | Atrash et al. |
| 8,584,961 B2 | 11/2013 | Teggatz et al. |
| 8,664,745 B2 | 3/2014 | Teggatz et al. |
| 8,687,385 B2 | 4/2014 | Teggatz et al. |
| 8,693,261 B2 | 4/2014 | Teggatz et al. |
| 8,704,450 B2 | 4/2014 | Chen et al. |
| 8,743,522 B2 | 6/2014 | Terratz et al. |
| 8,768,455 B2 | 7/2014 | Teggatz et al. |
| 8,896,318 B2 | 11/2014 | Teggatz et al. |
| 8,964,418 B2 | 2/2015 | Atrash et al. |
| 9,083,391 B2 | 7/2015 | Teggatz et al. |
| 9,089,029 B2 | 7/2015 | Teggatz et al. |
| 9,106,221 B2 | 8/2015 | Atrash et al. |
| 9,134,741 B2 | 9/2015 | Atrash et al. |
| 9,214,867 B2 | 12/2015 | Teggatz et al. |
| 9,225,199 B2 | 12/2015 | Teggatz et al. |
| 9,225,293 B2 | 12/2015 | Teggatz et al. |
| 9,231,400 B2 | 1/2016 | Chen et al. |
| 9,343,988 B2 | 5/2016 | Teggatz et al. |
| 9,354,268 B2 | 5/2016 | Teggatz et al. |
| 2002/0140234 A1 | 10/2002 | Wall et al. |
| 2004/0004483 A1 | 1/2004 | Hazelton |
| 2005/0151659 A1 | 7/2005 | Donovan et al. |
| 2007/0159186 A1 | 7/2007 | Grund |
| 2008/0053441 A1* | 3/2008 | Gottlib .............. A61M 16/0051 128/204.23 |
| 2009/0009180 A1 | 1/2009 | Varghai et al. |
| 2011/0008527 A1 | 1/2011 | Teggatz et al. |
| 2012/0025752 A1 | 2/2012 | Teggatz et al. |
| 2012/0028845 A1 | 2/2012 | Teggatz et al. |
| 2012/0139357 A1 | 6/2012 | Teggatz et al. |
| 2012/0188673 A1 | 7/2012 | Teggatz et al. |
| 2012/0242164 A1 | 9/2012 | Teggatz et al. |
| 2012/0248893 A1 | 10/2012 | Teggatz et al. |
| 2012/0274838 A1 | 11/2012 | Teggatz et al. |
| 2013/0062967 A1 | 3/2013 | Teggatz et al. |
| 2013/0175982 A1 | 7/2013 | Teggatz et al. |
| 2013/0181724 A1 | 7/2013 | Teggatz et al. |
| 2013/0193771 A1 | 8/2013 | Teggatz |
| 2013/0224679 A1 | 8/2013 | Teggatz et al. |
| 2013/0241465 A1 | 9/2013 | Teggatz et al. |
| 2013/0257171 A1 | 10/2013 | Teggatz et al. |
| 2013/0257172 A1 | 10/2013 | Teggatz et al. |
| 2014/0062381 A1 | 3/2014 | Teggatz et al. |
| 2014/0225447 A1 | 8/2014 | Teggatz |
| 2014/0329720 A1 | 11/2014 | Teggatz et al. |
| 2015/0171758 A1 | 6/2015 | Atrash et al. |
| 2015/0256227 A1 | 9/2015 | Teggatz et al. |
| 2015/0318899 A1 | 11/2015 | Teggatz et al. |
| 2015/0326118 A1 | 11/2015 | Teggatz et al. |
| 2015/0341087 A1 | 11/2015 | Moore et al. |
| 2015/0372676 A1 | 12/2015 | Teggatz et al. |
| 2016/0004267 A1 | 1/2016 | Atrash et al. |
| 2016/0033979 A1 | 2/2016 | Teggatz et al. |
| 2016/0105115 A1 | 4/2016 | Teggatz et al. |
| 2016/0134099 A1 | 5/2016 | Teggatz et al. |
| 2016/0134191 A1 | 5/2016 | Teggatz et al. |

* cited by examiner

ELECTRICAL INTERCONNECT STATUS MONITORING SYSTEM

PRIORITY ENTITLEMENT

This application a continuation of Ser. No. 14/553,941, filed Nov. 25, 2014, which is a continuation of Ser. No. 13/914,501 filed Jun. 10, 2013, now issued under U.S. Pat. No. 8,896,318 on Nov. 25, 2014, which is a continuation of Ser. No. 12/710,307, filed Feb. 22, 2010, now issued under U.S. Pat. No. 8,461,847 on Jun. 11, 2013, which claims benefit of provisional application No. 61/154,704 filed Feb. 23, 2009, which are incorporated herein by references.

TECHNICAL FIELD

The invention relates to monitoring the status of device connections in electrical systems for addressing concerns related to system reliability, quality, and safety. More particularly, the invention relates to monitoring the status of systems that include multi-wire interconnects and/or long transmission lines, especially systems that may be deployed in rough environmental conditions.

BACKGROUND OF THE INVENTION

In systems requiring that multiple loads be electrically coupled to one or more main lines, many connection approaches known in the arts may be used. The load lines may be connected off a main line in a linear transmission line configuration, star configuration, or daisy chain configuration, for example. An example familiar in the arts is a system configuration in which load lines are connected off the main line in a two-wire system with a transmission line configuration. A matrix configuration is also known in the arts, in which loads are connected to main lines using a web of load lines arranged in rows and columns. Those familiar with the arts will recognize that various combinations of such configurations may also be used, such as a linear transmission line connected with one or more star configuration, for example. The complexity of the connections may in some instances be very high and the connections may extend over a very large physical area.

Regardless which arrangement of system connections are used, the status of device connections in electrical systems can be outside acceptable limits due to poor installation, environment conditions, external conditions, and/or operational errors. If faulty connections are not detected, the individual device or entire system performance can be affected resulting in potential quality, reliability, and/or safety problems. Due to various challenges, monitoring the status of the interconnect system can be difficult at times. For example, when the connection lines are extremely long, on the order of kilometers, it becomes a challenge to find the locations of faulty connections or loads. Other challenges are environmental conditions that could directly contribute to the increased likelihood of faulty loads due to sharp objects, corrosive materials, extreme temperatures, wind, ice, etc. It would therefore be useful to have the capability to conveniently and reliably monitor the status of an interconnect system. One example that demonstrates a need for monitoring a complex interconnect system is in the mining industry, where electronic apparatus is used to control a substantially precisely timed string of detonations. Such a system often uses a multi-wire interconnect where all the device loads are tapped into the same signals at different points of the interconnect system. Marginal interconnect status of the tap wires and connections can affect performance of one or more devices. Conventional integrity check methods often fail to detect such marginal conditions. Due to these and other problems and potential problems, improved status monitoring of an interconnect system would be useful and advantageous in the arts. Reliable yet easy to use detection systems and methods would be particularly beneficial contributions to the art.

SUMMARY OF THE INVENTION

In carrying out the principles of the present invention, in accordance with preferred embodiments, the invention provides advances in the arts with novel methods and apparatus directed to detecting faulty connections in an electrical system. According to aspects of the invention, preferred embodiments include a basic connector type, a smart connector type, a DC monitoring system, an AC monitoring system, an RF monitoring system, a transmission line monitoring system, and a multi-wire monitoring system. Examples of each of various preferred embodiments of such monitoring systems are described.

According to one aspect of the invention, an example of a preferred method is disclosed for detecting and reporting faults, and the locations of faults, in an electrical interconnect with a main line and a number of loads. The method includes steps for monitoring signals at one or more device loads and analyzing the monitored signals for determining fault conditions at the device loads. In further steps, faulty loads are isolated from the main lines and load fault conditions are reported to a system master.

According to another aspect of the invention, in an exemplary embodiment, the method includes steps for monitoring signals at the main lines and analyzing the monitored signals for determining fault conditions at the main lines. In further steps, faults in the main lines are reported to a system master.

According to another aspect of the invention, an embodiment described includes steps for disabling all but one device load, transmitting a DC signal on the main lines, and measuring voltages at the enabled load. The measured voltages are compared to expected values and the existence of fault conditions is indicated when the voltage measured at that load is less than the expected value.

According to another aspect of the invention, an embodiment of a method for detecting and reporting faults includes the step of transmitting an AC signal on the main line. The AC signal has one or more pulses of known magnitude, width, and frequency parameters, at least one of which is monitored. Reflected pulse signals at the main line are measured and compared with one or more of the expected parameters for determining whether fault conditions exist.

According to another aspect of the invention, in an example of a preferred embodiment, a method includes monitoring signals at device loads by sending command signals from a system master to one or more loads to command the loads to enter a diagnostic mode. In a further step, radio frequency (RF) signals are generated and transmitted at one or more of the loads operating in diagnostic mode. The RF signals are detected and received at the main line, and fault conditions at the loads as well as on the main line are identified by comparing parameters of the received RF signals, such as the amplitude, frequency, and phase, with expected values.

According to another aspect of the invention, an example of a preferred method is disclosed for detecting and reporting faults, and the locations of faults, in an electrical interconnect system having a main line and a number of loads. In the method, one or more additional wire lines connected to one or more device loads is used for monitoring the current flow through the one or more additional wire lines. Fault conditions in one or more device loads are indicated by increases or decreases in current in the one or more additional wire lines relative to the main lines and are reported to a system master.

According to another aspect of the invention, in an embodiment of the methods described, the steps of monitoring signals at device loads further includes using one or more additional wire lines each connected to one or more device loads through a switch. The steps include monitoring current flow through the one or more additional wire lines while operating all device loads in a quiescent mode in which the loads do not draw current. By switching on each of the device loads individually, current detected in the one or more additional wire line or lines may be used to detect fault conditions.

According to another aspect of the invention, a preferred embodiment of a system for detecting faults, reporting faults, and detecting the locations of faults in an electrical interconnect system having a main line and a plurality of device loads is disclosed. The system includes monitoring modules at device loads for monitoring signals at the load lines and analyzing modules for determining fault conditions at the device loads based on the monitored signals. A communication module is provided for reporting fault conditions and locations to a system master.

According to yet another aspect of the invention, a preferred embodiment of the fault detecting system provides one or more monitoring modules at the main line for monitoring signals at the load lines and main line. Also included are one or more analyzing modules at the main line for determining fault conditions at device loads and main line based on the monitored signals. Communication modules at the main line for reporting fault conditions at the device loads or at the main line to a system master.

According to yet another aspect of the invention, in a preferred embodiment of a electrical interconnect status monitoring system, a DC transmitter is included for transmitting the DC signals from the main line to device loads for monitoring and analyzing fault conditions.

According to another aspect of the invention, a preferred embodiment of a electrical interconnect status monitoring system includes an AC transmitter for transmitting AC signals from the main line to device loads for use in monitoring and analyzing fault conditions.

According to another aspect of the invention, preferred embodiments are described in which one or more RF transmitters at one or more device loads in the system may be used for transmitting RF signals to monitoring devices at the main line.

The invention has advantages including but not limited to providing one or more of the following features; improved accuracy and safety in monitoring the status of device connections in electrical systems, including the ability to test and monitor connections without fully activating the system. These and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as front, back, top, bottom, upper, side, et cetera, refer to the drawings themselves as laid out on the paper and not to physical limitations of the invention unless specifically noted. The drawings are not to scale, and some features of embodiments shown and discussed are simplified or amplified for illustrating principles and features, as well as anticipated and unanticipated advantages of the invention.

DESCRIPTION OF PREFERRED EMBODIMENTS

While the making and using of various exemplary embodiments of the invention are discussed herein, it should be appreciated that the present invention provides inventive concepts which can be embodied in a wide variety of specific contexts. It should be understood that the invention may be practiced with various electronic circuits, systems, system components, and subsystems without altering the principles of the invention. For purposes of clarity, detailed descriptions of functions, components, and systems familiar to those skilled in the applicable arts are not included. In general, the invention provides electrical connection status monitoring of multiple connections within an electrical system, providing capabilities for identifying and locating faulty connections. Preferably, the connection status monitoring may be performed with the system in a test mode, facilitating the making of repairs prior to full activation of the system.

Figure 1:
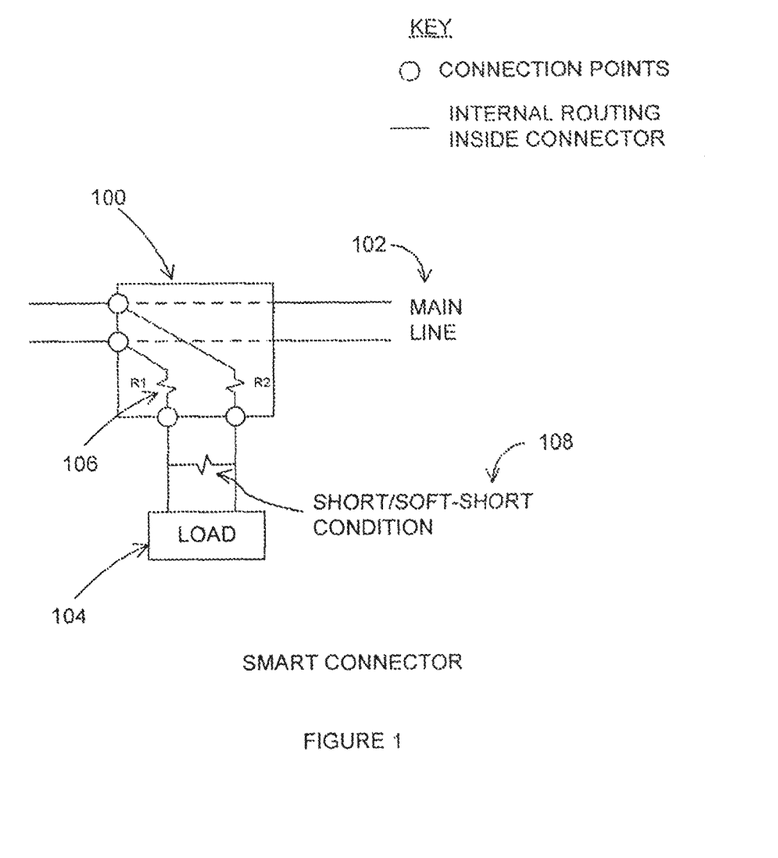
FIG. 1 is a simplified schematic diagram illustrating an example of a preferred embodiment of an electrical interconnect status monitoring system and method utilizing a resistance placed between the load and the main line for the purpose of fault detection.

In one preferred embodiment, illustrated in FIG. 1, a smart connector 100 placed at the connection point between main lines 102 and device loads 104 includes one or more resistive elements 106. Optionally, another resistive element 108 is placed between the two input wires of the load 104 for the purpose of detecting short and soft short conditions. In this preferred embodiment, the purpose of the resistors 106 is to provide isolation of the load 104 from the main line 102. In case of a short in the load 104, the resistors 106, prevent the short from disturbing the main line 102. This maintains functionality of the main line and any other loads also connected to it. During system query, a shorted load cannot respond, while a properly connected load can. This facilitates identifying the failure location.

Figure 2:
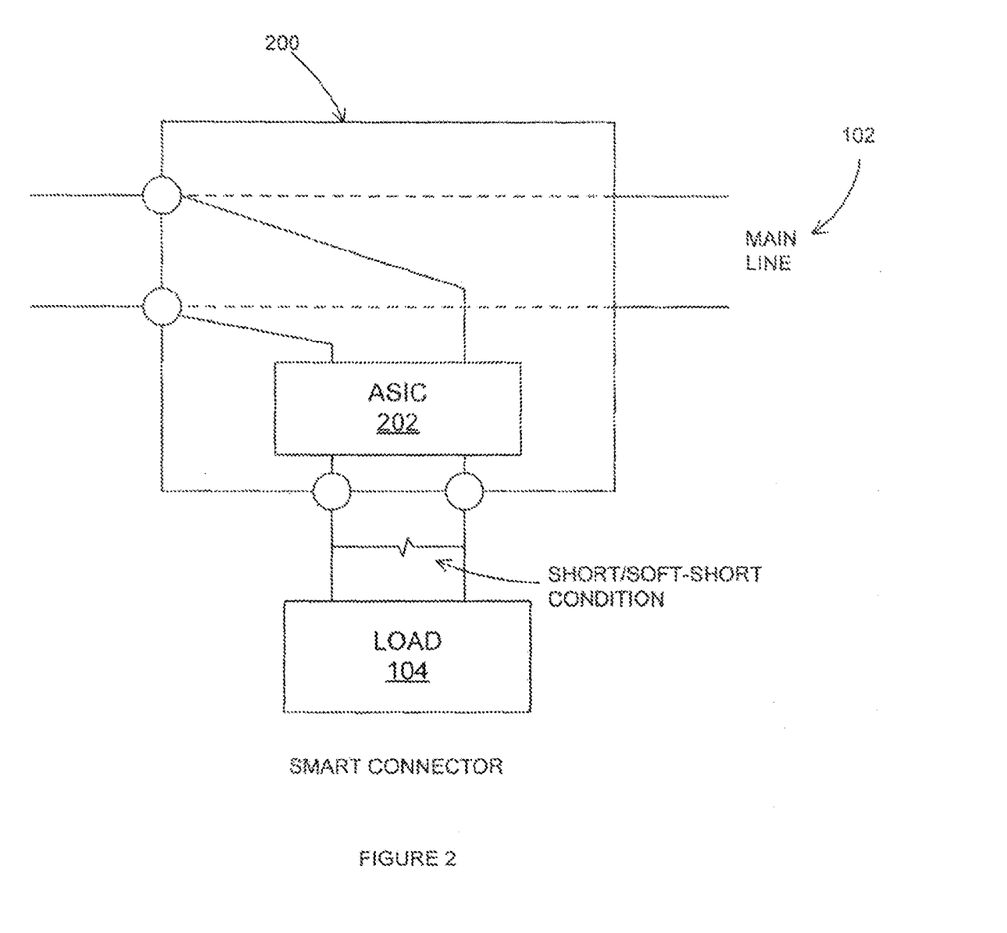
FIG. 2 is a simplified schematic diagram illustrating an example of a preferred embodiment of an electrical interconnect status monitoring system and method using an ASIC placed between the load and the main line for the purpose of fault monitoring.

Now referring primarily to FIG. 2, in another preferred embodiment, a smart connector 200 includes an ASIC (Application Specific Integrated Circuit) 202 placed between the main lines 102 and device loads 104. The purposes of the ASIC 202 is to detect, analyze and report fault conditions associated with the loads 104 or main line 102. In the case of a short at a load, e.g., 104, higher currents are pulled from the main line 102. The ASIC 202 then latches off and isolates the faulty load 104 from the main line 102. The ASIC 202 also preferably includes a communication module that is used to report which load(s) are faulty once the faulty loads are identified and isolated.

Figure 3:
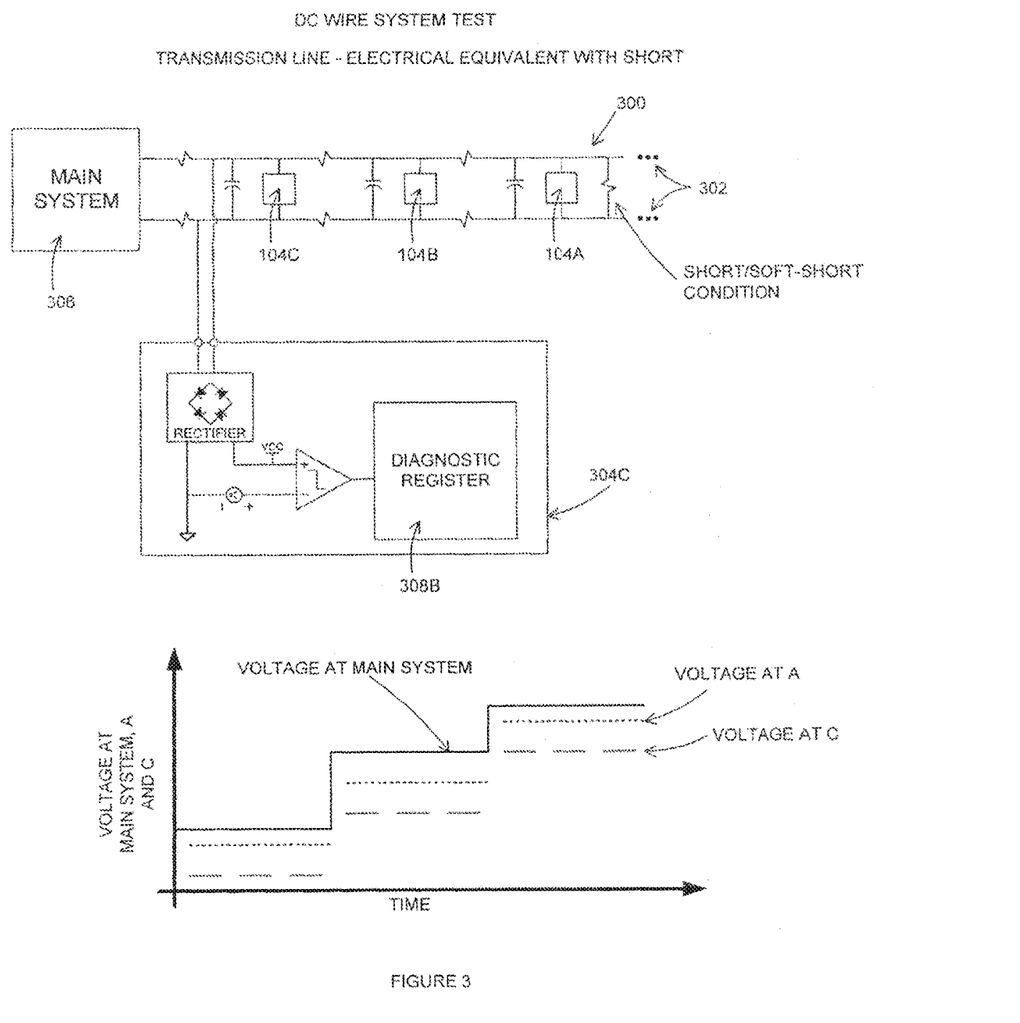
FIG. 3 is a simplified schematic diagram illustrating an example of a preferred embodiment of an electrical interconnect status monitoring system and method with a DC monitoring module for detecting fault conditions.

In another preferred embodiment, an example of which is illustrated in FIG. 3, an electrical interconnect system 300 using a transmission line configuration 302 includes multiple loads 104A, 104B, 104C, etc., and preferably, multiple DC monitoring modules 304 for monitoring the lines 302 and detecting short and soft short conditions in the loads 104A, 104B, 104C, as shown. The DC monitoring module 304C, shown in the inset, preferably includes a diagnostic mode to disable all but one load, e.g., 104C. The enabled load 104C monitoring module 304C measures the signals at its inputs, thus determining the status of the connection from the main line 302 to the inputs of the load 104C, and reports its status to the system master 306. If a faulty condition exists, the device, e.g. 304C, would either not communicate back to the master 306 or be disabled, thereby making it known to the master 306, which load is faulty. Preferably, internal diagnostics 308B at the load circuitry 304C is used to detect and report the existence of soft short conditions where a voltage drop can be detected across the faulty load. Preferably, one or more diagnostic modes may be implemented in which selected loads may be placed in an autonomous mode in order to mimic isolation from the main line. This can preferably be achieved by utilizing an internal capacitor to supply the load circuitry operating in diagnostic mode, whereby power from the main line is not required for testing.

Figure 4:
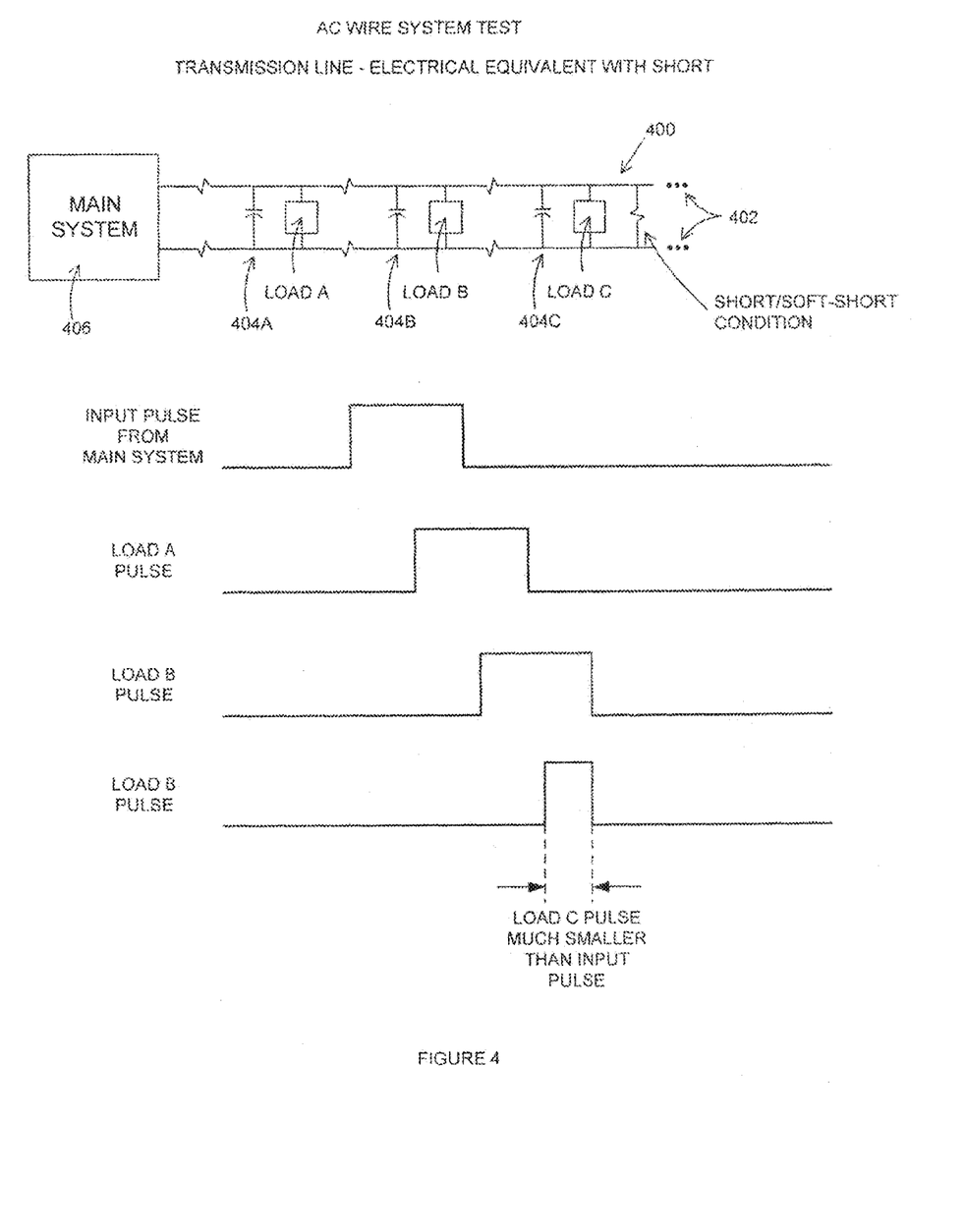
FIG. 4 is a simplified schematic diagram illustrating an example of a preferred embodiment of an electrical interconnect status monitoring system and method using an AC monitoring module for detecting fault conditions.

FIG. 4 illustrates a transmission line configuration 400 for an electrical equipment system main line 402, and AC checks 404A, 404B, 404C . . . , monitoring signals for detecting short and soft short conditions in the loads. AC checks are used to monitor the status of an interconnect system relying on the AC characteristics of the main line and load lines. Preferably, a pulse or group of pulses of defined magnitude, width, and frequency are transmitted on the main line 402. Each load monitor, e.g., 404C, measures the resulting signals at its respective inputs, and compares them to a set of fixed expected values, or configurable expected values, and reports back its status to the master 406. If faulty, the monitoring devices would either not communicate back to the master or be disabled, thereby making it known to the master which loads are faulty. In preferred embodiments of an AC monitoring system, each load would alternatively, report back what it had measured for one or more of pulse width, magnitude, and frequency and allow the master to determine the status of the loads. In presently preferred embodiments, the use of pulse width evaluation is predominant.

Figure 5:
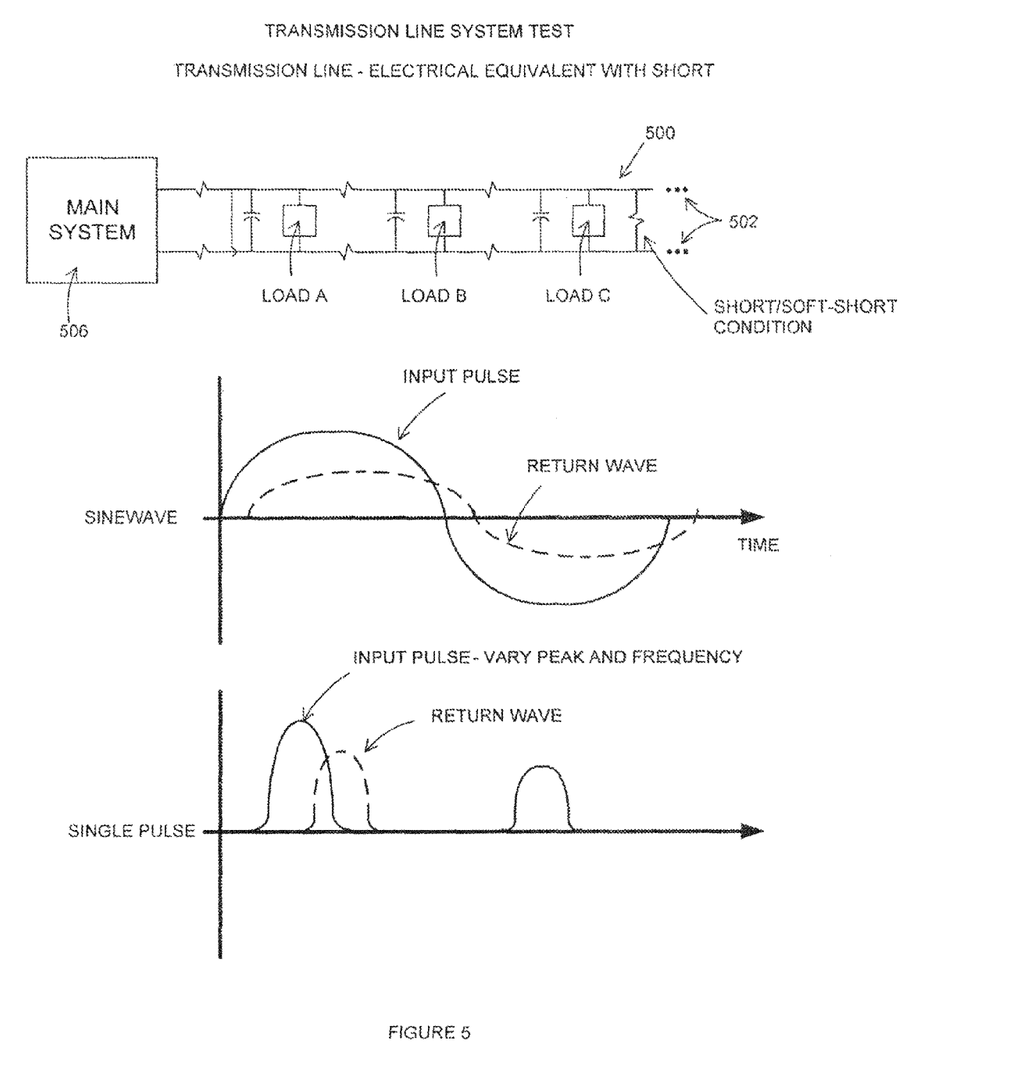
FIG. 5 is a simplified schematic diagram illustrating an example of a preferred embodiment of an electrical interconnect status monitoring system and method utilizing a transmission line configuration for monitoring signals observed on the main line for detecting fault conditions.

In an example of another preferred embodiment, FIG. 5 illustrates a transmission line configuration 500 for an electrical equipment system, and transmission line monitoring signals observed on the main line that consist of transmitted as well as reflected waveforms for detecting short and soft short conditions in the loads. Using this approach, master circuitry 506 is used to directly monitor the reflections off the main line 502. Preferably, a signal pulse such as a sine wave or single pulse is transmitted on the main line 502. The reflected wave returning from the main line 502 is then sensed by the master 506. The resulting reflected signal is a function of the integrity of the main line 502. The signal characteristics and time delay of the reflected signal give indications of where faults in the line exist. Preferably in the transmission line approach, a termination impedance may be utilized both on the main line and load lines to optimize the line impedance.

Figure 6:
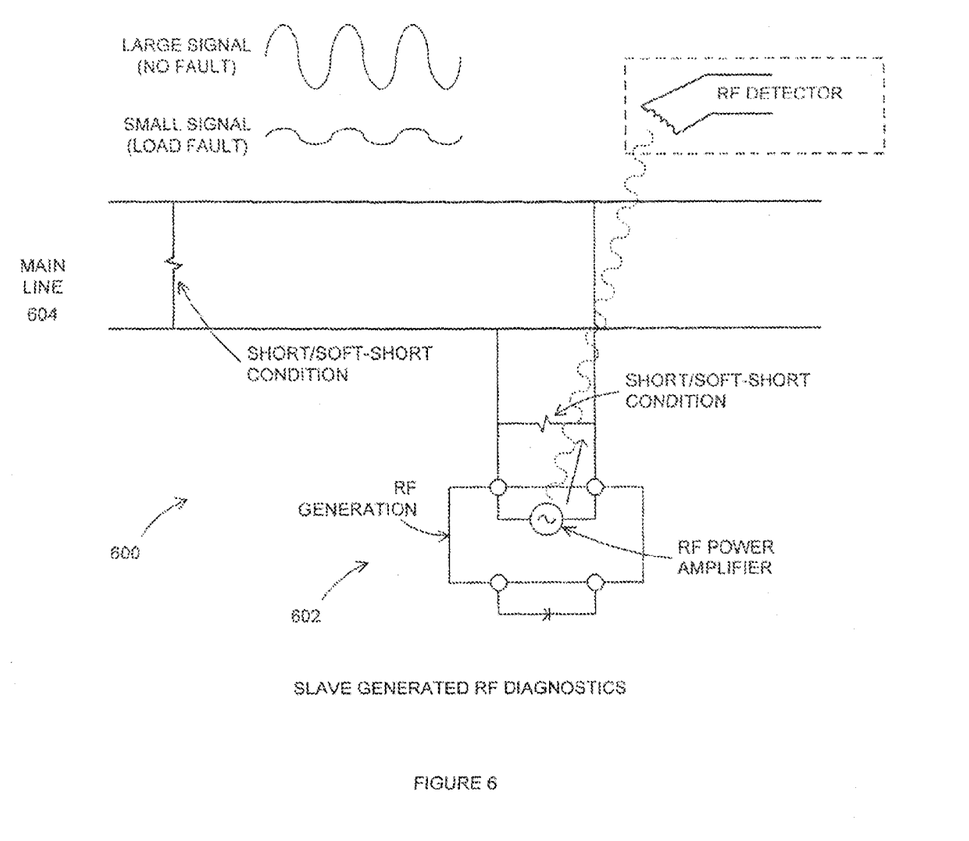
FIG. 6 is a simplified schematic diagram illustrating an example of a preferred embodiment of an electrical interconnect status monitoring system and method with an RF signal generator and RF detector for detecting fault conditions.

Now referring primarily to FIG. 6, an RF monitoring system 600 is illustrated that is capable of detecting short or soft short conditions. Preferably, each load to be monitored is equipped with a module 602 capable of generating an RF signal on the load terminals, and each load and monitoring device may be operated in a diagnostic mode. In the diagnostic mode, a monitoring device RF signal generator transmits one or more RF signals to a nearby RF detector. If a load has a fault such as a short or soft short, the RF detector in turn either receives no signal or a small signal relative to the expected signal for conditions wherein the load is without fault. This technique may also be used for detecting the existence of faults on the main line 604.

Figure 7:
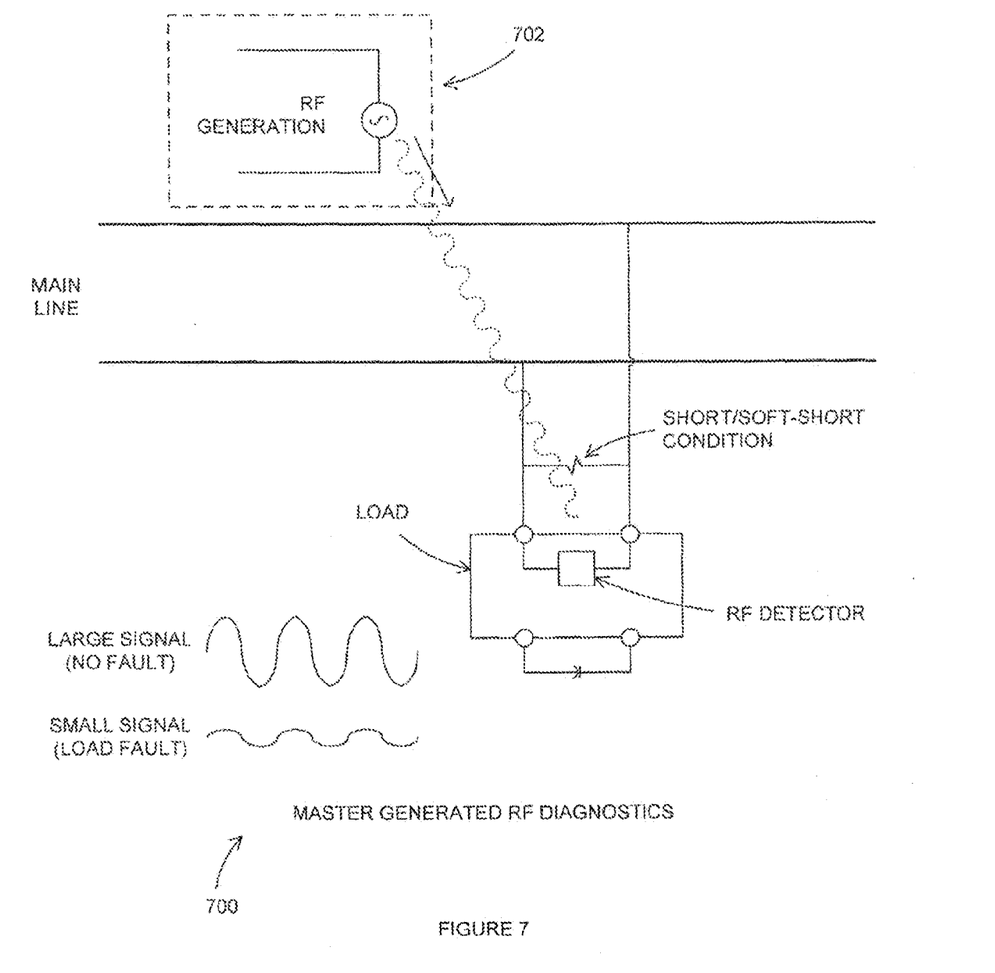
FIG. 7 is a simplified schematic diagram illustrating an example of a preferred embodiment of an electrical interconnect status monitoring system and method with an RF signal generator external to the device load paired with an RF signal detector at the load for detecting fault conditions.

In another example of an alternative RF monitoring system 700 and method, as depicted in FIG. 7, an RF signal generator 702 is preferably located external to the loads, and an RF signal detector is located at the load(s) to be monitored. If a monitored load has a soft short or short, the detected RF signal at the load is small, or nonexistent, compared with expected normal signal levels when the circuit is without fault. The monitored load condition can then in turn be reported to indicate the status of particular loads.

Figure 8:
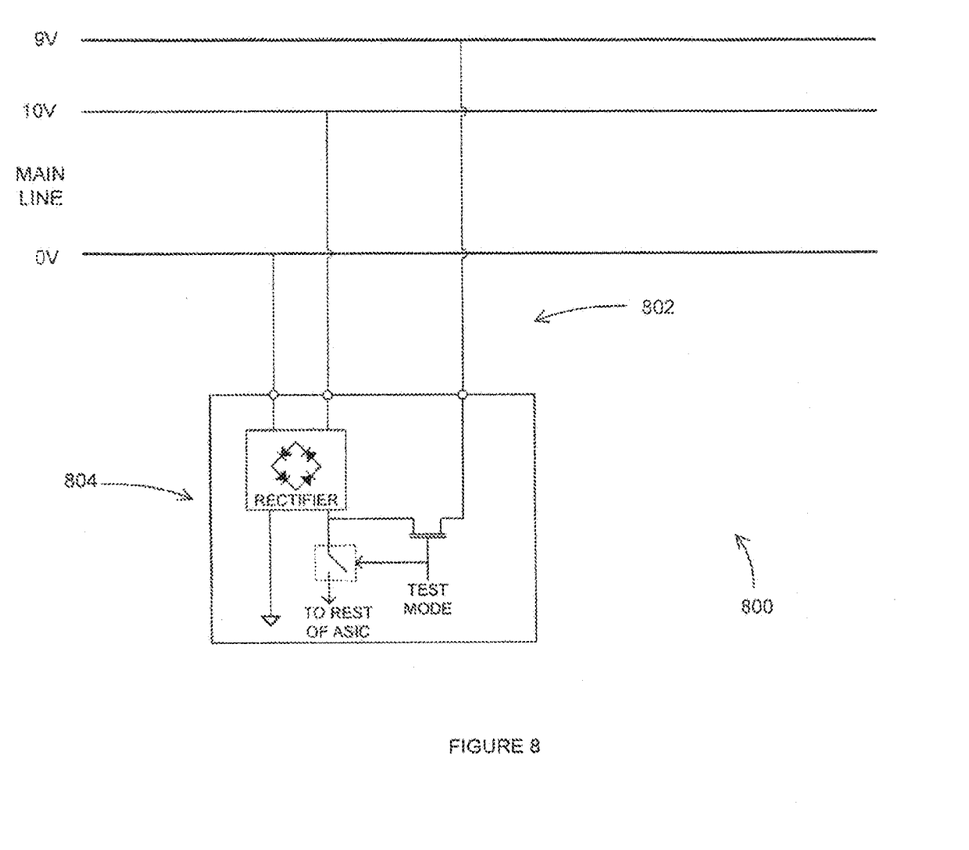
FIG. 8 is a simplified schematic diagram illustrating an example of a preferred embodiment of an electrical interconnect status monitoring system and method with a wire connected to the load through a switch to one side of a bridge diode placed between the inputs of the load for detecting fault conditions.

FIG. 8 illustrates a multi-wire monitoring system 800 and method for detecting short or soft short fault conditions. One or more wires 802 is deployed to connect to each of the monitored loads through a switch to one side of one or more bridge diodes 804 placed between the inputs of the load. If one or more faulty loads exists, the current in the additional wire(s) increases or decreases relative to the current in the main line(s) 806, indicating the existence and location of the faulty loads. Preferably, in a multi-wire monitoring system as described above, each of the monitored load circuits may be independently placed in a quiescent diagnostic mode with no current load. In this mode, only one load circuit has the monitoring switch turned on at any given time. In the event that current is observed in the monitoring wire(s), the presence of a fault is indicated for that particular load.

The methods and apparatus of the invention provide one or more advantages including but not limited to, electrical interconnect status monitoring efficiency, safety, convenience, and reduced cost. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. A monitoring circuit comprising:
    a load interface;
    a conductor interface;
    a controller configured to operate in a plurality of modes of operation, including a diagnostic mode, a disable mode and an operating mode wherein the disable mode disconnects the load interface from the conductor interface and the operating mode connects the load interface to the conductor interface;
    wherein the controller is configured to receive a monitoring signal having known magnitude and frequency parameters and to transmit a signal in response; and
    wherein the controller is configured to change an operational parameter as a function of the mode of operation of the controller in response to the monitoring signal.

2. The system of claim 1 further comprising a main system configured to determine whether a fault condition exists by analyzing the response signal from the controller.

3. The system of claim 1 further comprising a main system configured to measure at least one or more parameters comprising a time delay of the response signal or a data value of a reflected signal, and to determine whether a fault condition exists by comparing the measured parameter with an expected parameter.

4. The system of claim 1 further comprising a main system configured to analyze a response signal, to determine fault conditions at a selected device load, to isolate the faulty device load from conductors, and to report load fault conditions.

5. The system of claim 1 further comprising a main system configured to disable all but one of a plurality of loads, to transmit a DC signal on conductors, to measure a voltage at the enabled load, and to compare the measured voltage to an expected value.

6. The system of claim 1 further comprising a main system configured to transmit a signal, receive a return signal, analyze characteristics of the return signal and determine whether fault conditions exist by comparing the characteristics of the return signal with expected characteristics.

7. The system of claim 1 further comprising a main system configured to send command signals to command a selected load to enter a diagnostic mode, generate and transmit signals to the selected load operating in diagnostic mode, detect and receive a response signal, and analyze and determine fault conditions at the selected load by comparing one or more of an amplitude, frequency, and phase of the response signals with an expected signal parameter.

8. The system of claim 1 wherein the monitoring circuit comprises a diode bridge.

9. The system of claim 1 wherein the monitoring circuit comprises a diagnostic register.

10. The system of claim 1 wherein the monitoring circuit comprises a radio frequency detector.

11. The system of claim 1 further comprising three conductors coupled to the monitoring circuit, wherein the controller is configured to operate in a test mode and a main system is configured to transmit a control signal to activate the test mode.

12. A monitoring system comprising:
    a controller configured 1) to receive a signal having known magnitude and frequency parameters, 2) to transmit response signals, 3) to encode data into the response signals, 4) to enable a main system to determine whether fault conditions exist by comparing the extracted data with expected data, 5) to enable the main system to monitor current flow through one or more wire lines, 6) to enable the main system to report the fault conditions, 7) to enable the main system to analyze the response signals and determine fault conditions at a selected device load, 8) to enable the main system to isolate a faulty device load from a main line, and, 9) to enable the main system to report load fault conditions, wherein if fault conditions exist in the selected device load, the current in the one or more additional wire lines increases or decreases relative to the main lines; and
    wherein the controller is configured to operate in a diagnostic mode, a disable mode and an operating mode.

13. The system of claim 12 wherein the main system is configured to transmit a signal on the main line.

14. The system of claim 12 wherein the main system is configured to disable all but one load.

15. The system of claim 12 wherein the main system is configured to receive a signal from the main line.

16. The system of claim 12 wherein the main system is configured to send command signals to command a selected load to enter a diagnostic mode, to generate and transmit signals to the selected load operating in diagnostic mode, to detect and receive a response signal, and to analyze and determine fault conditions at the selected load.

17. The system of claim 12 wherein the controller comprises a diode bridge.

18. The system of claim 12 wherein the controller comprises a diagnostic register.

19. A system comprising:
    a monitoring circuit coupled to a load and at least one conductor, the monitoring circuit having a diagnostic mode, a disable mode and an operating mode, wherein the monitoring circuit can be controlled to be in the disable mode or the operating mode, and wherein the disable mode disconnects the load associated with the monitoring circuit from the at least one conductor and the operating mode connects the load associated with the monitoring circuit to the at least one conductor;
    wherein the monitoring circuit is configured 1) to receive a monitoring signal from a main system and to transmit response signals to the main system, 2) to enable the main system to determine whether a fault condition exists from the response signals, 3) to enable the main system to disable the load and 4) to receive command signals to command the load to enter a diagnostic mode; and
    wherein the monitoring circuit is configured to change a parameter to indicate the mode of operation.

* * * * *

UNITED STATES PATENT AND TRADEMARK OFFICE
CERTIFICATE OF CORRECTION

PATENT NO.         : 9,599,660 B2  
APPLICATION NO.    : 15/165870  
DATED              : March 21, 2017  
INVENTOR(S)        : Ross E. Teggatz et al.

Page 1 of 1

It is certified that error appears in the above-identified patent and that said Letters Patent is hereby corrected as shown below:

On the Title Page

1. In Item (71), under "Applicant", in Column 1, Line 1, delete "IP" and insert -- IP, --, therefor.

2. In Item (72), under "Inventors", in Column 1, Line 1, delete "Ross E" and insert -- Ross E. --, therefor.

3. In Item (72), under "Inventors", in Column 1, Line 2, delete "Wayne T" and insert -- Wayne T. --, therefor.

4. On Page 2, in Item (56), under "U.S. PATENT DOCUMENTS", in Column 2, Line 6, delete "Gottlib" and insert -- Gottlib et al. --, therefor.

In the Claims

5. In Column 7, Line 40, in Claim 4, delete "a response signal," and insert -- the response signal, --, therefor.

6. In Column 7, Lines 41-42, in Claim 4, delete "the faulty device load" and insert -- a faulty device load --, therefor.

7. In Column 8, Line 59, in Claim 19, delete "load and" and insert -- load, and --, therefor.

Signed and Sealed this  
Thirtieth Day of May, 2017

Michelle K. Lee  
*Director of the United States Patent and Trademark Office*